(12) United States Patent
Johnson

(10) Patent No.: US 6,812,874 B1
(45) Date of Patent: Nov. 2, 2004

(54) METHOD AND APPARATUS FOR PROCESSING ANALOG SIGNAL

(75) Inventor: Robert Everest Johnson, Randolph, NJ (US)

(73) Assignee: Andrew Corporation, Orland Park, IL (US)

( * ) Notice: Subject to any disclaimer, the term of this patent is extended or adjusted under 35 U.S.C. 154(b) by 0 days.

(21) Appl. No.: 10/443,508

(22) Filed: May 22, 2003

Related U.S. Application Data

(60) Provisional application No. 60/382,706, filed on May 22, 2002.

(51) Int. Cl.[7] .............................................. H03M 1/00
(52) U.S. Cl. ..................................... 341/110; 341/155
(58) Field of Search ................................ 341/155, 110, 341/113, 126, 145, 156, 165; 702/63, 89; 708/404

(56) References Cited

U.S. PATENT DOCUMENTS 5,552,999 A * 9/1996 Polgreen et al. .............. 702/63
6,279,022 B1 * 8/2001 Miao et al. .................. 708/404
6,463,392 B1 * 10/2002 Nygaard et al. .............. 702/89

* cited by examiner

Primary Examiner—Jean Bruner Jeanglaude
(74) Attorney, Agent, or Firm—Mayor Fortkort & Williams, PC; Michael P. Fortkort, Esq.; Karin L. William, Esq.

(57) ABSTRACT

An apparatus for processing an analog signal includes a programmable signal converter in which a mapping between input voltages and output voltages is loaded into an input-to-output mapping device, e.g., one or more look-up tables. The resulting device has a lower cost, introduces a shorter delay, requires significantly less circuit board real estate, and has a higher operating frequency than the existing devices. An exemplary embodiment includes an analog-to-analog converter disposed in an integrated package or on a single chip integrated circuit that includes an input converter, an input-to-output mapping device and a digital-to-analog converter. The traditional encoding/decoding process on the output of the digital-to-analog conversion is replaced in this embodiment by using the input converter to drive address mapping values in the input-to-output mapping device, e.g., entries in a lookup table, thereby significantly speeding up the process.

45 Claims, 15 Drawing Sheets

FIG. 5C
Exclusive OR Gate
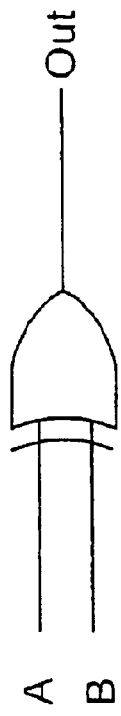
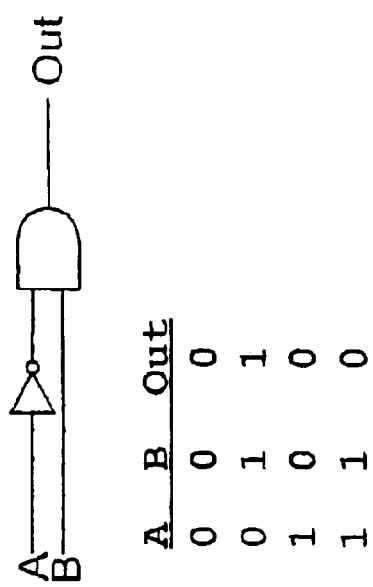
FIG. 5D
FIG. 5A
AND Gate with inverted input
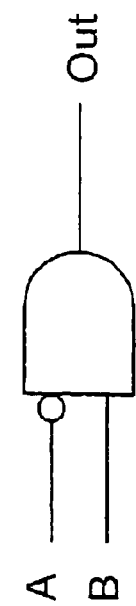
FIG. 5B

MAPPABLE ANALOG TO ANALOG CONVERTER

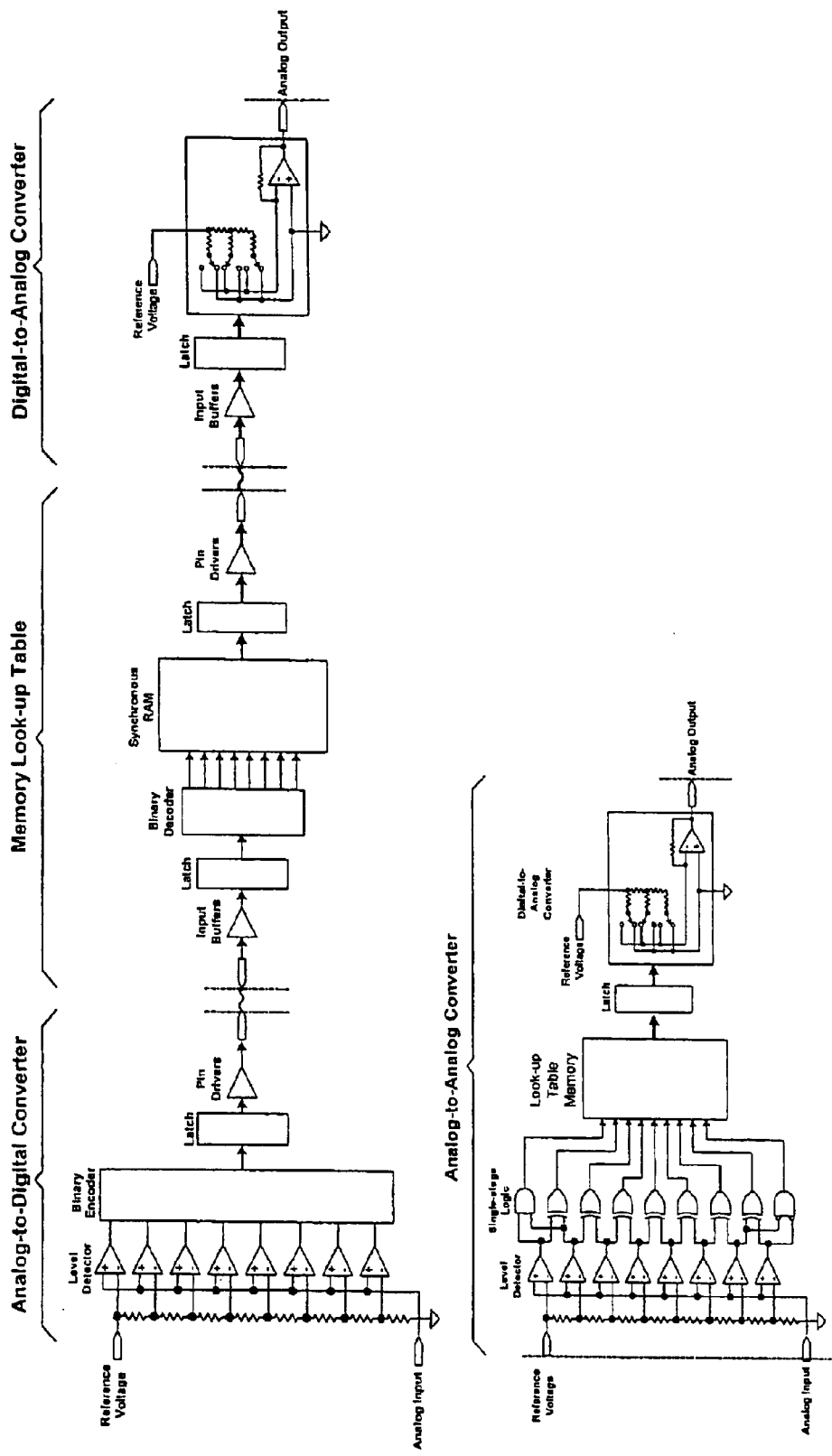

METHOD AND APPARATUS FOR PROCESSING ANALOG SIGNAL

STATEMENT OF RELATED APPLICATION

This application claims the benefit of priority to U.S. Provisional Patent Application No. 60/382,706, filed May 22, 2002, entitled "Method And Apparatus For Processing Analog Signal."

FIELD OF THE INVENTION

The present invention relates generally to methods and apparatus for processing electrical signals, and more particularly to a method and apparatus for processing an electrical signal that is in analog form.

BACKGROUND

Techniques for processing analog electrical signals are well known. Processing can occur in the analog domain using diodes, transistors, operational amplifiers, etc., or in the digital domain after the signal has been digitized or measured, by means of an analog-to-digital converter. Analog-to-digital converter (ADC) design continues to advance rapidly both in resolution, accuracy, and conversion speed. Additionally, ADC integrated circuits have been to incorporate some of the circuit functions that traditionally were packaged as separate devices.

Resolution, accuracy and speed are traded off against each other depending upon the intended use and application. A so-called FLASH type of ADC is limited to a lower resolution and accuracy by converts quite rapidly. A successive-approximation type of ADC has high resolution and accuracy but requires more time to complete the conversion. Sigma-Delta ADCs take a very long time to complete but can measure with a voltage accuracy of greater than 1 part in a million. Each of the ADC architectures has a place in the wide range of electronic systems in use today.

Analog-to-Digital converters are practically always connected to computers. Since binary coding is the usual language of digital circuitry, ADCs virtually without exception present their output in a binary code to simplify their connection to the computer's data bus. Typically the computer will read the ADC data when the computer program commands it, or the data is read continuously from the ADC and written into digital memory whereby the computer retrieves the plurality of stored data at a later time.

This output format blends well with successive-approximation ADCs since their internal architecture calculates each binary output bit from the most significant bit, one-by-one, down to the least significant bit. Binary formatting is a natural product of the successive-approximation algorithm.

A sigma-delta ADC is essentially very low-resolution converter whose output is averaged over a long period of time to arrive at a high-resolution value. The averaging is done with digital filtering techniques, which also naturally produce binary formatted data.

FLASH ADCs are the least amendable to producing a binary output and a complex encoding circuit is required to reduce the measuring circuits output into a binary code. The reduction to binary makes up a significant portion of the FLASH ADCs conversion time. They are still faster by far than the two other types.

In systems that require the fastest analog-to-digital conversion rates, the FLASH ADC is the only choice. An example of such a system is an existing amplifier system in which a radio frequency (RF) signal requires modification before application in a manner equal and opposite to the predicted unwanted distortion introduced by the power amplifier. The correction applied is a function of the RF input signal's power envelope. The power envelope is sensed by a diode detector device, which outputs a voltage that is rapidly sampled by an 8-bit FLASH ADC. Prior to outputting the digital value, the value is naturally encoded into an eight-bit binary word. This value is used to select one or more values from a digital memory. As part of this selection process, the nominally 8-bit encoded value is decoded to select the unique memory location. These values stored in memory are numerical correction coefficients. The correction coefficients selected by any particular power level are output from memory to digital-to-analog converters (DACs). The DACs output voltages modify, by various means, the original RF signal to effect the distortion reduction. Since the signal processing by the detector, analog-to-digital converter, the correction coefficient look-up, and the digital-to-analog converters take a discrete amount of time; the RF signal must be delayed by the same time interval by e.g., using an RF delay element.

The analog-to-digital converter encoding delay is typically on the order of three clock cycles. The look-up-table and the digital-to-analog converters each typically introduce an additional clock delay or two. This relatively large amount of delay is a significant cost factor in these distortion reduction circuits. The RF delay element is expensive and difficult to package. In one implementation of this circuit, the delay required can be on the order of 100 nanoseconds (ns) or longer. Furthermore, the cost of the delay element is proportional to the required delay. For example, in an implementation of an RF delay element, a shielded and tuned wave-guide is used to provide the necessary delay, which wave-guide can cost on the order of $100 per implementation depending upon the exact delay required.

In addition to the above problems caused by delays, the above-mentioned circuit requires several expensive components due to inter alia linear performance requirements. The required analog-to-digital converter, look-up-table and digital-to-analog converter typically must operate at high frequencies, for example 100–300 MHz, which nearly represents the current limit of the technology for these type of circuits (i.e., analog-to-digital converters and digital-to-analog converters) that exhibit good linear accuracy without undue cost.

FLASH analog-to-digital converters usually employ an architecture where the input voltage to be measured is compared to each tap of a resistor ladder network. The resistor ladder network divides a reference voltage into many fractional voltage steps. The reference voltage sets the range over which the input voltage can be measured. The input voltage is compared to each fractional voltage with a separate analog comparator. Analog comparators receive the two input voltages and output a digital signal, which represents a Boolean true if the input voltage, is greater than the reference voltage step at each resistor tap. The position of the boundary between the comparators indicating a Boolean true and those indicating false is encoded into the ADCs binary output code. During manufacture, the resistor ladder may not contain equal ohmic values, so the voltage steps would not be equally spaced. As linearity is a strongly desired, even expected characteristic of ADCs, the devices resistor values are laser trimmed. This trimming process adds to the device cost. The same is true for digital-to-analog converters.

The Radio Frequency (RF) detector used in this application must have a wide dynamic range. Such detectors inherently exhibit non-linear responses at the high and low ends of their frequency ranges. Wide range linear detectors are prohibitively expensive for the given application.

Similar problems exist in analog processors used in other applications. Processing speed, accuracy, and dynamic range are often sacrificed for cost purposes, and complexity must be added to the system elsewhere to accommodate these limitations.

The present invention is therefore directed to the problem of developing a method and apparatus for processing analog signals in a fast, cost-effective manner while improving speed and accuracy.

SUMMARY OF THE INVENTION

The present invention solves these and other problems by providing inter alia a method and apparatus for processing an analog signal that includes a rapid input conversion process that uses a boundary detection of logic on its output side and an input-to-output mapping process, wherein the outputs of the boundary detection of logic drive the addresses of the input-to-output mapping process. A complete conversion of the input amplitude to a binary encoded word is avoided, thereby significantly reducing throughput delay. Optionally, the above method and apparatus include a digital-to-analog conversion process depending upon the form of the desired output.

According to another aspect of the present invention, an exemplary embodiment of an analog-to-analog converter comprises an integrated package that includes an input converter, a lookup table, and a digital-to-analog converter, and a method for loading the lookup table values. As the analog-to-digital-to-analog converter (ADAC) is disposed in a single integrated package several advantages become possible. The binary encoding process on the output of the traditional analog-to-digital conversion, which typically requires three or more clock cycles, is replaced with a faster scheme (which typically requires one or fewer clock cycles), wherein the binary outputs are used to address the memory of the lookup table, thereby significantly speeding up the overall process. This is accomplished by coupling the outputs of comparators through a boundary detection of logic to the individual memory locations, directly deriving the memory addresses from the comparator outputs.

Furthermore, placing these components in a single integrated package reduces the necessity for strictly linear performance since deviations from the ideal transfer characteristic can be accommodated by or "folded into" the mapping values loaded into the memory lookup tables. In addition, common reference voltages and clocks can be used for all three processes, which reduces the stability required on these elements.

Depending upon the desired output form, e.g., if an analog output is desired, when an output becomes active from one comparator the correct memory location is read and this value is used to drive the digital-to-analog converter, thereby providing a rapid conversion step.

Accordingly, one aspect of the present invention includes a programmable analog-to-analog converter in which a mapping between input voltages and output voltages is loaded into one or more look-up tables. The resulting device has a lower cost, introduces a shorter delay, requires significantly less circuit board real estate, and has a higher operating frequency than existing devices.

The above methods and apparatuses have many applications and variants, which will become apparent to one of skill in this field from a reading of the following description while referring to the attached drawings.

BRIEF DESCRIPTION OF THE DRAWINGS

FIGS. 5A–D depict digital comparators used in the exemplary embodiment of FIG. 4.

FIG. 15 depicts a comparison of a traditional analog-to-digital converter to lookup table to digital-to-analog converter component chain and an exemplary embodiment of an analog-to-analog converter of the present invention.

DETAILED DESCRIPTION

It is worthy to note that any reference herein to "one embodiment" or "an embodiment" means that a particular feature, structure, or characteristic described in connection with the embodiment is included in at least one embodiment of the invention. The appearance of the phrase "in one embodiment" in various places in the specification are not necessarily all referring to the same embodiment.

It is also instructive to note that outputs of digital circuits can be in one of two states. These states are referred to variously as high/low, true/false, or '1'/'0'.

The embodiments of the present invention include a rapid input conversion process that includes a boundary detection of logic whose outputs are coupled to an input-to-output mapping process, whereby the memory locations of the input-to-output mapping process are integrally coupled together to provide rapid throughput for the resulting device. Such embodiments have many applications, including but not limited to uses as amplifiers, sensors, converters, controllers, inverters, doublers, etc. Essentially, any requirement for receiving an analog input and providing an output that has some predetermined relationship to the input can be served by the embodiments herein, whether the ultimate form of the output signal is analog or digital.

Exemplary Embodiment of an Analog Processor

Figure 11:
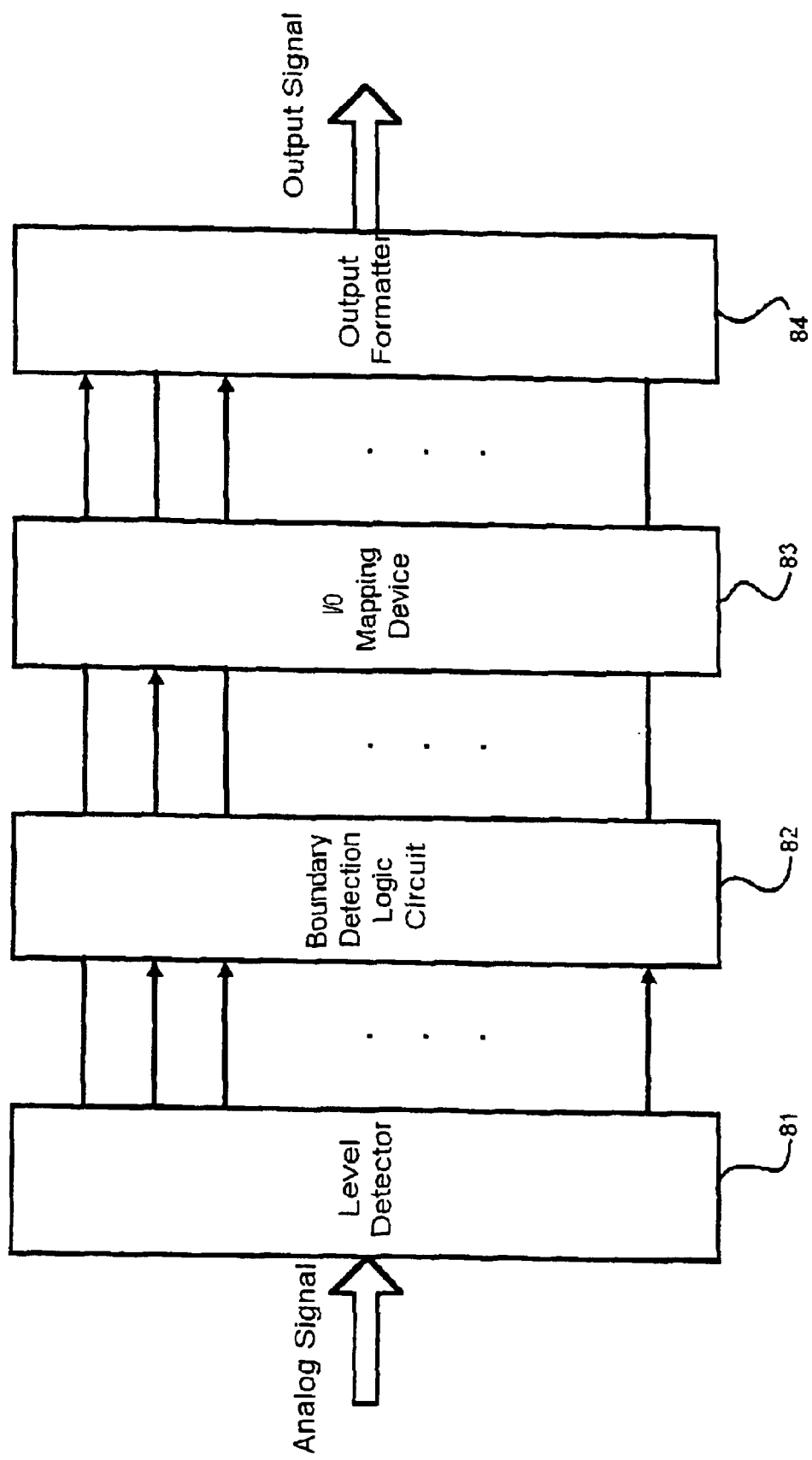
FIG. 11 depicts an exemplary embodiment of an apparatus for processing an analog signal according to another aspect of the present invention.

An exemplary embodiment of an analog processor according to one aspect of the present invention is shown in FIG. 11. The embodiment 80 converts an incoming analog signal to another signal, which is either in digital or analog form, based on some predetermined mapping of the input amplitude to the desired output amplitude.

The embodiment 80 includes a level detector 81, a boundary detection logic circuit 82, an input-to-output mapping device 83 and an output formatter 84. An analog signal is applied to the input of the level detector 81, which has one output for each level of granularity desired in the embodiment 80. Arrows indicate an example of which of the output lines output a high logic level, while the remaining outputs without arrows output a low logic level. The level detector indicates each level that has been exceeded by the input voltage, which levels are indicated by example as arrows. In operation, the outputs will rise and fall as the amplitude of the input signal varies across the measurement range of the level detector 81.

The outputs of the level detector 81 are coupled to the inputs of the boundary detection logic circuit 82. This circuit 82 determines the highest level that has been exceeded by the input voltage. This logic circuit 82 requires only one level of logic gate so that its outputs are valid after a minimal delay. The normal additional levels of logic required to create a binary encoded output are avoided. Rather, only a single level of digital logic (e.g., a bank of simple logic gates) is required. Depending upon the circuit delays and the speed at which the input signal is changing, a bank of registers or latches may be employed to ensure that the outputs remain stable for the proper time duration in the clock cycle. When used in an application in which the input signal is rapidly changing, a track and hold circuit can be used at the level detector's input to "freeze" the input signal for the duration of the memory access time.

Only one of the outputs of the boundary detection logic circuit 82 is active at one time, depending upon the outputs of the level detector 81. Thus, the output related to the highest non-zero input is indicated with an arrow in the continuing example as active. There are at least as many outputs of the boundary detection logic circuit 82 as there are outputs of the level detector 81, and perhaps at least one more than the number of outputs of the level detector 81 to indicate an under-voltage condition. When all of the level detector outputs are low, this could be construed as an under voltage condition where the input voltage is below the valid voltage range. Similarly, when all of the level detector outputs are high the input voltage is above the valid voltage range.

The active output of the boundary detection logic circuit 82 is used to drive the input-to-output mapping device 83, which includes a predetermined mapping from a measured value to a desired value. The input-to-output mapping device 83 outputs the selected mapping value in digital form to the output formatter 84. The output of the input-to-output mapping device 83 may consist of multiple digital lines, which are coupled to the output formatter 84. Lines shown with arrows indicate these lines contain high logic level values, whereas the remaining lines in this continuing example are shown without arrows to indicate low logic level values. The number of output lines from the input-to-output mapping device 83 is independent of the number of inputs to the input-to-output mapping device 83. The number of inputs is related to the desired granularity of the overall device, whereas the number of outputs is related to the width of the digital value contained in the input-to-output mapping device.

The output formatter converts the output by the input-to-output mapping device 83 to either a digital word or an analog signal level, depending upon the desired form of the output. If an analog form of output is desired, the output formatter 83 includes a digital-to-analog converter. If the output is desired to be in digital form, the output formatter may simply provide the output signals directly or via a latched circuit, or it may include combinatorial circuitry to modify the output without requiring the input-to-output mapping values to be altered, or it may include a clocked sequential circuit, such as a digital filter.

Figure 4:
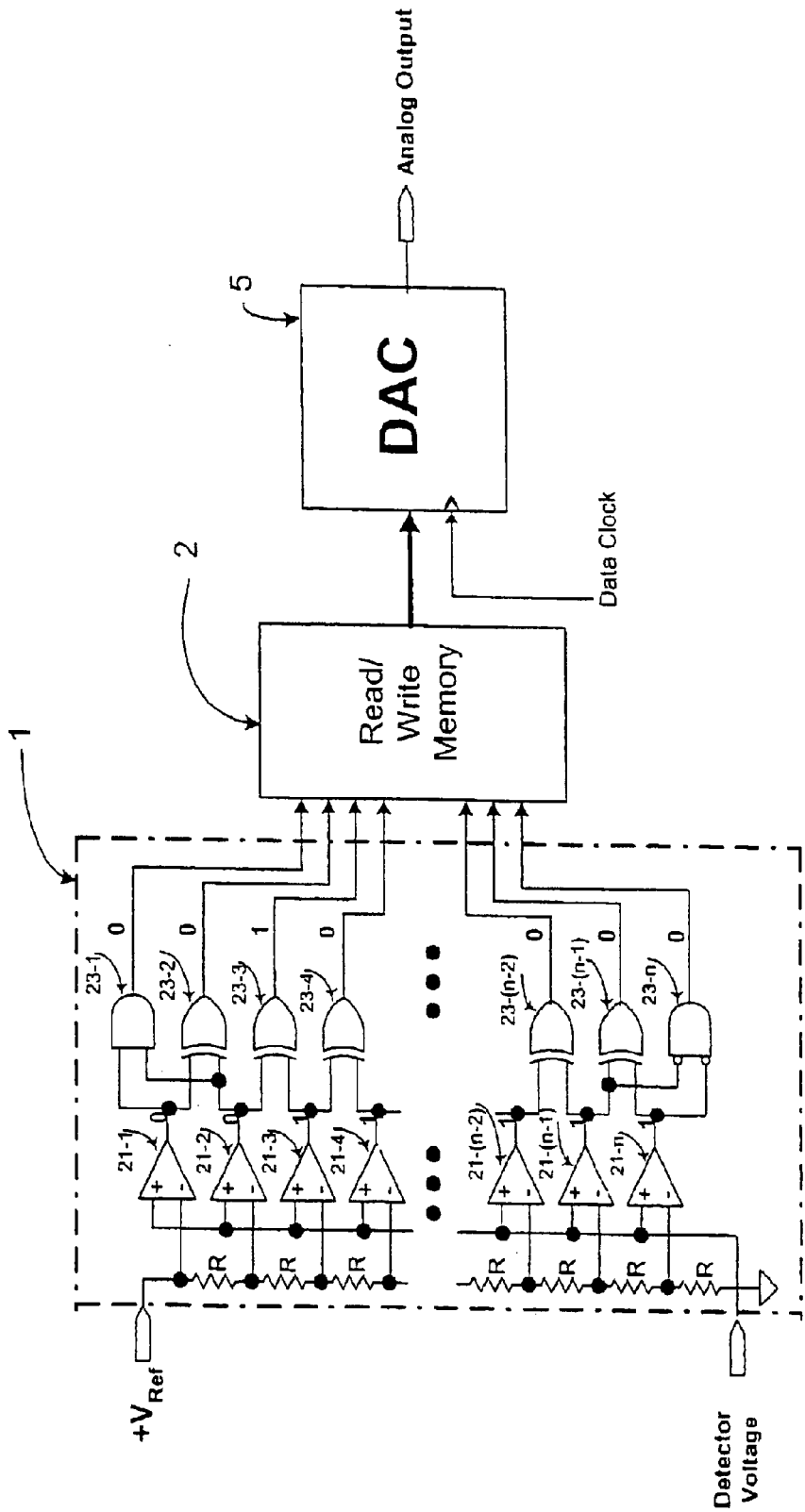
FIG. 4 depicts a block diagram of an exemplary embodiment of an analog-to-analog converter according to one aspect of the present invention.

An exemplary embodiment of the level detector 81 includes a resistor ladder that subdivides the reference voltage into many discrete steps. Each voltage step connects to an analog comparator for comparison with the input voltage being measured. The input voltage "climbs" the resistor-comparator ladder as the input voltage increases. Only when the input voltage has risen to the level of a particular resistor stage, does that stage's comparator output state change from a high state to a low state. An exemplary embodiment of a resistor ladder network is shown in FIG. 4 (element 1).

The number of steps in the resistor ladder determines the granularity or resolution of the device. This number can be an integral power of 2 as is customary with digital devices, but could also be 50, 75, 100, 200, or 533 as appropriate for the requirements of the application. The manufacturing processes will limit the maximum number of steps.

An exemplary embodiment of the boundary detection logic circuit 82 includes a parallel bank of gates whose inputs are coupled to the outputs of two adjacent digital comparators. The gates detect the condition when logic '0' and logic '1' are output from adjacent comparators. Either an Exclusive-OR gate or an AND gate with one inverted input can used. Exclusive-OR gates output a '1' when the two inputs receive opposite values; otherwise they output a '0'. The AND gate version works since, with a positive reference voltage, a logic '0' always appears above a logic '1' at the boundary position. The AND gate would afford the shortest delay while the Exclusive-OR gate version would permit the reference voltage to be either a positive or negative voltage. See FIGS. 5A–D for the logic functions expressed by these two gate types.

Other digital circuits, which provide one active signal at a time at their output, may be employed to generate the input to the mapping device, without departing from the scope of the present invention.

An exemplary embodiment of the input-to-output mapping device 83 includes a lookup table (LUT) stored in memory whose stored values are addressed by read signals connected to each read location individually. The outputs of these boundary detection gates connect directly to the input-to-output mapping device. This provides faster selection of the desired memory location than conventional multi-bit binary address input by eliminating entirely, the requirement to decode the input address at all.

Exemplary Embodiment of an Analog-to-Analog Converter

According to another aspect of the present invention, an exemplary embodiment for processing an analog signal includes a single integrated package converting an analog signal to another analog signal, i.e., an analog-to-analog converter. The single integrated package has disposed on it an input converter (e.g., the resistor ladder and comparator portion of a traditional FLASH (ADC)), a boundary detection logic circuit, an input-to-output mapping device, and a digital-to-analog converter (DAC). This analog-to-analog converter could be disposed on a single integrated circuit die, or on separate circuit die interconnected using conventional multi-chip module techniques without departing from the scope of the invention.

Exemplary Embodiment of a Mapable Analog-to-Digital Converter

Figure 14:
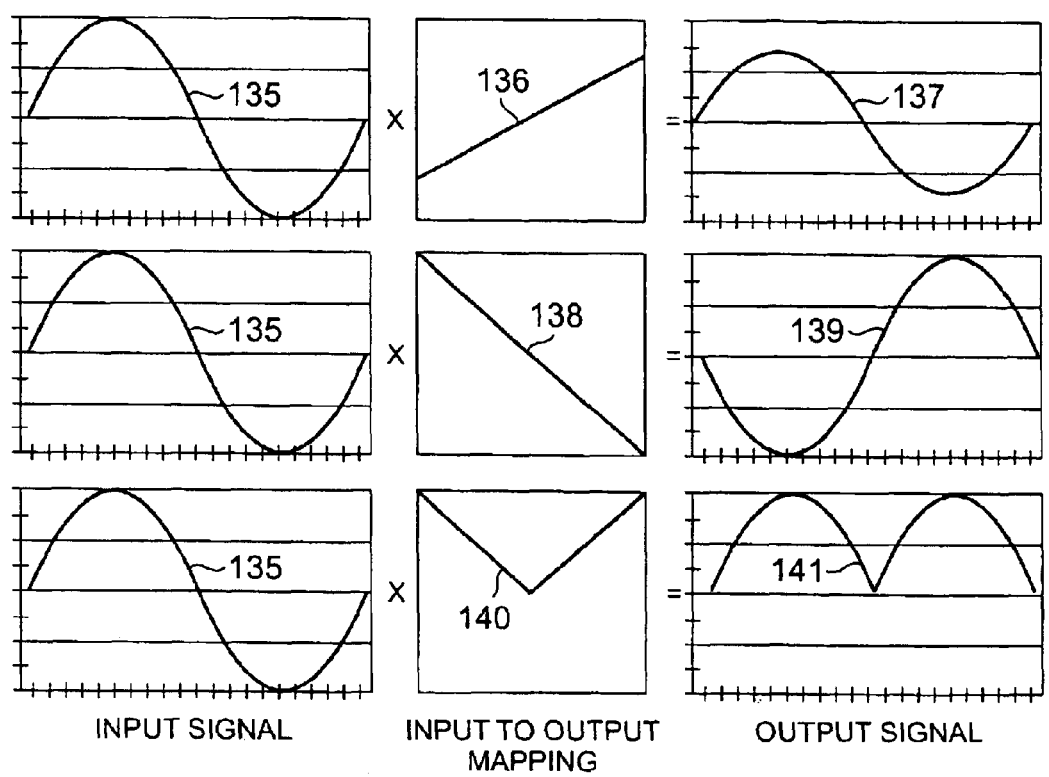
FIG. 14 depicts various input-output signals as modified by embodiments of the present invention.

According to another aspect of the present invention, in another exemplary embodiment the input converter is disposed in the same integrated package as the input-to-output mapping device. In this embodiment, input-to-output mapping device is loaded with values that impart signal-processing functions to an analog-to-digital converter. If a straight-line function is programmed into the memory, changing the "tilt" and or the offset of the ramp function can modify the gain and of offset of the output. Turning to FIG. 14, if input signal 135 is applied to the analog input with an input-to-output mapping values in RAM graphically represented by the transfer function 136, the output 137 has the same shape as the input 135 but with reduced amplitude. Look-up table values represented graphically by transfer function 138 create an inverted output 139. Look-up table values represented graphically by transfer function 140 produce a rectified output 141. These are just a few of the virtually limitless possible input-to-output mappings.

Moreover, in one embodiment the outputs of the input-to-output mapping device (e.g., a look-up table stored in memory) are coupled directly to inputs of a digital-to-analog converter, thereby preventing further delays. The end result is a completely programmable analog-to-analog converter that allows waveform shaping to user's specifications. By specifying the input-to-output mapping values, which, e.g., are stored in a look-up table in a memory, the user can precisely control the conversion of the input value to an output value, thereby creating any desired arbitrary waveform transformation.

Figure 6:
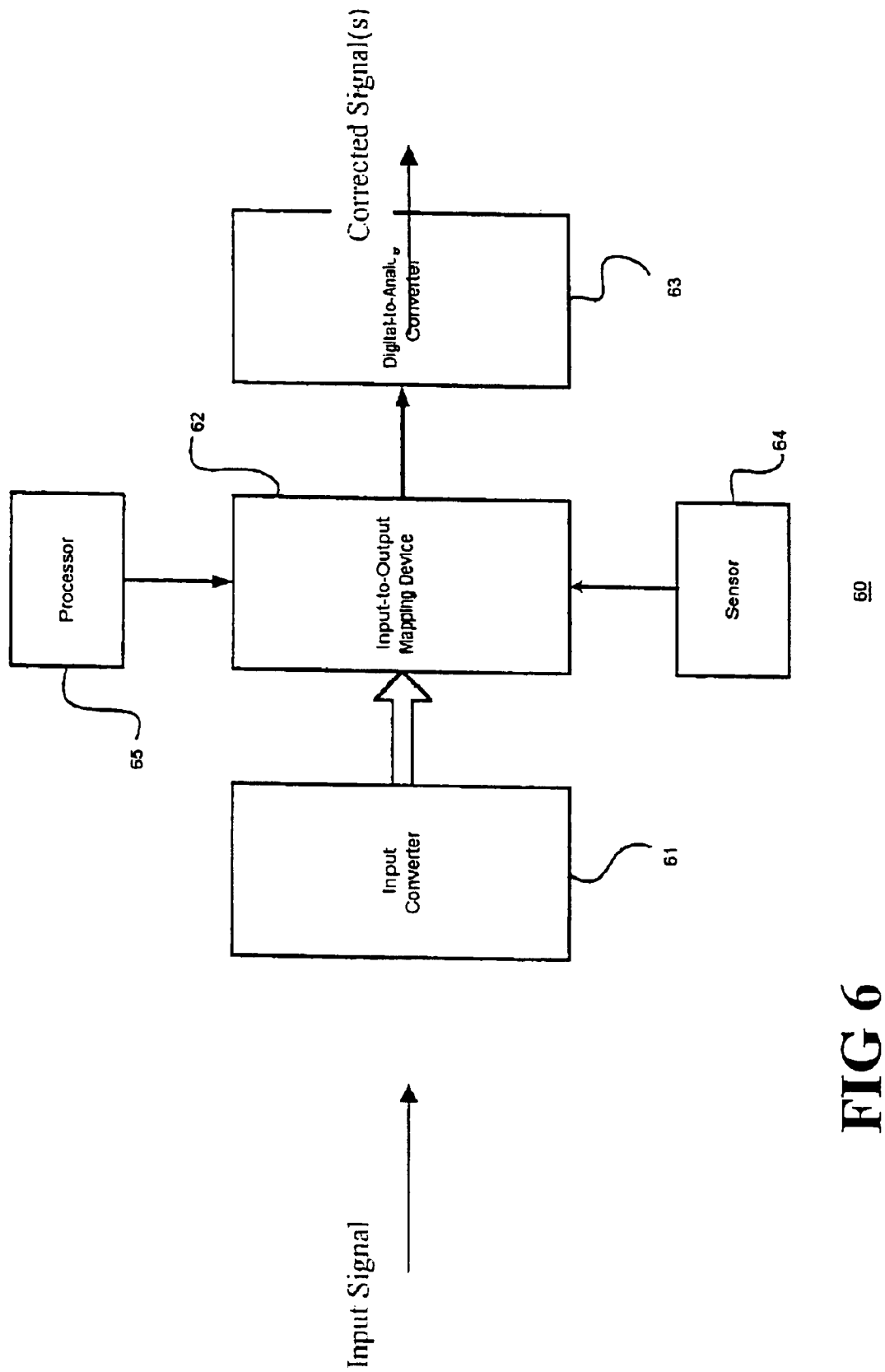
FIG. 6 depicts a block diagram of an exemplary embodiment of an analog processor according to still another aspect of the present invention.

An exemplary embodiment 60 of such a device is shown in FIG. 6. An input converter 61 converts the incoming signal to a mapping address, which addresses a mapping value in an input-to-output mapping device 62. The output from the input converter 61 includes multiple lines, which are shown as a bus arrow to indicate more than one line. The number of lines is directly related to the levels used in the input conversion and the number of mapping values used in the input-to-output mapping device. For example, using 256 discrete levels in the input conversion process allows one to control the mapping from the input to the output very finely. The input-to-output mapping device will then provide at least 256 mapping values, i.e., at least one for each level of the conversion process. This mapping value is uniquely specified to map a particular value of the input waveform to a particular value for an output waveform. The output of the input-to-output mapping device can either be a digital value stored in the input-to-output mapping device, or the digital value can then be converted to an analog value by a digital-to-analog converter 63. An external sensor 64 can be employed in the selection of the input-to-output mapping value, as discussed below. A processor 65 can be used to write the mapping values into the input-to-output mapping device, either during a manufacturing process, during initialization or on an on-going basis in a dynamic manner, as discussed below.

According to another aspect of the present invention, an embodiment for processing an analog signal includes an external input to the input-to-output mapping that enables a dynamic entry of the mapping values, thereby enabling a dynamic input-to-output mapping. This provides a highly flexible analog signal processor.

Exemplary Embodiment of An Amplifier

According to still another aspect of the present invention, an embodiment for amplifying a signal in a long chain of amplifiers, such as in a cable or fiber optic communication system, the mapping values are accessible by a system operator via the dynamic entry port. This enables the system operator to dynamically correct for fluctuations in system performance due to unknown issues, media degradation, or other dynamic influences. Moreover, each separate amplifier can be individually addressed and its mapping values modified, thereby enabling still further precision in the control process by the system operator.

One possible use for such an analog processor is to correct the mapping values for external influences, such as temperature or other operating conditions. Other potential uses include corrections for lifetime degradation and other slowly moving processes that affect the performance of these devices. By enabling external rewriting of the mapping values, one can continue to operate these devices long beyond that which was heretofore possible.

Exemplary Embodiment of An Analog Processor that Employs Multiple I/O Mappings

According to another aspect of the present invention, an embodiment for processing an analog signal includes multiple tables of input-to-output mapping and a control or selection input by which the preferred mapping table can be selected. This enables one to provide multiple versions of the same table and to use an external device, e.g., a sensor, to determine or select the appropriate mapping table. For example, to select the appropriate mapping table based on the external temperature, one could employ a temperature sensor, the output of which can be used as a control or selection signal to select the desired mapping table.

Input-to-Output Mapping

With regard to the input-to-output mapping used in the various embodiments herein, to modify the incoming signal, the user simply creates the mapping from the input values to the desired output values and stores them in memory, e.g., in a look-up table. Any linear or non-linear transfer function responses in the conversion processes can be accounted for in the mapping values stored in the look-up table, thereby enabling more inexpensive components to be used in the analog-to-analog converter or analog processors set forth herein.

Level Detector and Boundary Detection Logic Circuit

The architecture of some of the exemplary embodiments herein includes a level detector followed by a boundary detection logic circuit without any encoding circuits. This process requires only monotonic performance but not linear performance, thereby significantly reducing the cost contribution of this component to the overall device. Monotonicity is the property that an increase of the voltage at the input, never results in a decrease of the output. This is an inherent property of the resistor ladder topology. The level detector of the embodiments herein includes multiple comparator outputs. The comparator outputs are then gated with each adjacent comparator output to create the boundary logic circuit. Assuming monotonic performance, only one boundary detection gate becomes active (e.g., high) at a time.

I/O Mapping Device

The exemplary embodiment of the I/O Mapping device includes a random access memory (RAM), in which certain coefficients are stored. The read locations of these coefficient RAMs are each addressed by a separate activation line derived from the comparator outputs through the boundary detection gates. The coefficient RAMs are loaded from an external source via a serial interface.

The output of the RAM can be connected on-chip directly to the output formatter. Alternatively, this connection can be within a single integrated package using multichip interconnection techniques. By keeping all of the signal paths on-chip or at least in a single integrated package, great economies and performance benefits are realized including low pin count, static protection simplification, and lower capacitive effects. All of these lead to faster operation with less delay. The sharing of voltage reference and clock circuits are additional benefits.

A serial data bus for loading and reading back the correction coefficients can be used to characterize the level detector, the boundary detection logic circuit and the digital-to-analog converters. By allowing the reading of boundary detection gate outputs, the input to the I/O Mapping device for a known voltage input can be determined. Any non-linear performance can be recorded and factored into the correction coefficients. Additionally, by loading known values into the RAM memory, the characteristics of the Digital-to-analog converter can be determined.

Output Formatter

One exemplary embodiment of the Output Formatter includes a digital-to-analog converter whose inputs are connected to RAM data outputs. In some of the embodiments herein, the couplings between the inputs of the digital-to-analog converter are connected on the same chip to the RAM data outputs. Alternatively, these couplings can be accomplished in a single integrated package.

The digital-to-analog converter also merely requires monotonic performance rather than linear performance as in the prior art device, thereby significantly reducing the cost of this component and the resulting device as well. When disposed on a single chip or in a single integrated package, a common voltage reference can supply the level detector, the boundary detection logic and the output formatter. This reduces errors due to voltage references differences that exist when the voltage references are on different integrated circuit chips or at least not in a single integrated package. Moreover, in such a configuration a common clock can be used for the boundary detection logic and the digital-to-analog converter. This reduces errors due to clock skew or duty cycle differences that exist when the clocks are on different integrated circuit chips or at least not a single integrated package.

The linearity requirements can also be removed from the level detector, the boundary detection logic circuit and the digital-to-analog converter just as the RF detector's non-linear transfer function is accommodated within the derivation of the amplifiers coefficients. By using the boundary detector comparator outputs to address the individual RAM locations, the time to address memory is shortened as the encoding of the large number of comparators outputs to a binary coded value, then decoding this same value back to one of a large number of RAM location read lines is not required.

Additional Embodiment

Figure 1:
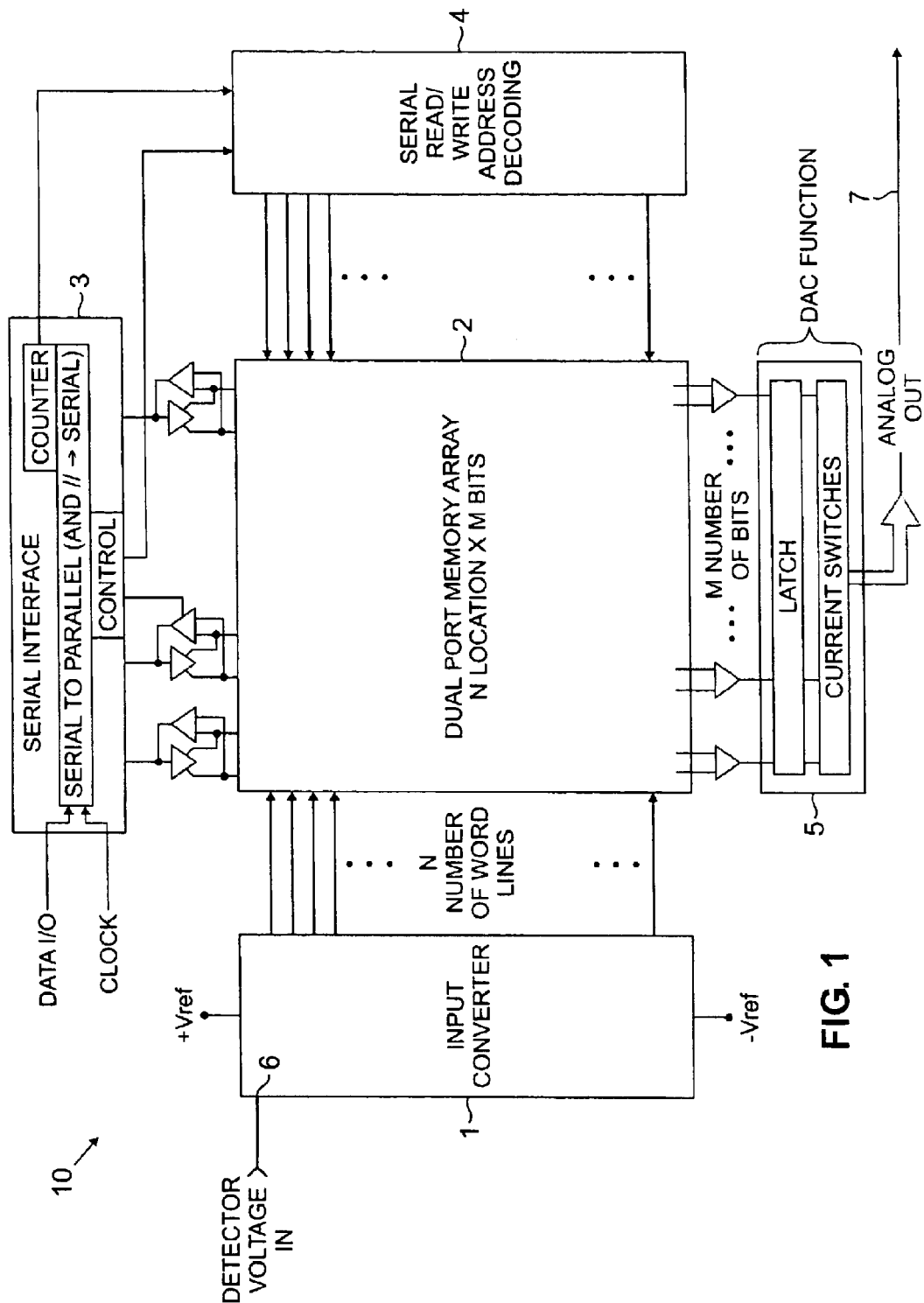
FIG. 1 depicts a block diagram of an exemplary embodiment of an analog-to-analog converter according to one aspect of the present invention.

Turning to FIG. 1, shown therein is a block diagram of an exemplary embodiment 10 according to one aspect of the present invention. The block diagram consists of these main blocks: a FLASH analog-to-digital converter 1 with individual range signal outputs, a dual-port memory array 2 consisting of one write port and two read ports, a serial interface 3, Serial Address Decoder 4, and digital-to-analog converter 5. The duel-port RAM 2 array has two sets of word Lines and two sets of Bit Lines to allow writing from the serial interface 3, or for reading from either analog-to-digital converter 1 or from the serial interface 3.

The serial interface 3 can operate under any of several standard methods. Some of these methods use only two wires—one for a clock and one for bi-directional data. This method serially shifts the data in and makes it available in parallel form for loading into the RAM. An up-counter keeps track the address into which the data is to be loaded or from which the data is read. Other control signals from the serial interface synchronize the read and write processes.

The Serial Address Decoder 4 decodes the serial interface's address up-counter to activate one word line during each read or write of a serial data transfer. This decoding would not benefit from the boundary detection scheme used from the ADC side since reading and writing to and from RAM from the serial interface occurs relatively slowly and.

In a further embodiment, a read only memory (ROM) can be used if the mapping values for a particular application are fixed values and never require change. Such an embodiment would be lower in cost since the serial interface would not be required. Other types of memories could be employed such as an EEPROM device, which could be programmed at the time of manufacture, or while in use with the benefit that the contents are not erased if power is removed from the system.

In operation, the FLASH analog-to-digital converter 1 receives the input signal at the IN pin 6. On the output side of the analog-to-digital converter 1 and N word lines (e.g., as many as 256 or more). The number of word lines N is selected based on the level of fine control and accuracy desired in the overall device 10. The more lines output, the finer control possible in the device 10. Many more output lines are possible given that the output lines tie directly into the memory array 2 without going off-chip. The N word lines are each connected to a memory cell in a memory array 2, which has N locations by M bits. The N word lines act as address lines, but do not require a decoder as only one of these N address lines are active at a time.

A serial interface 3 provides the capability of loading the memory 2 with the desired mapping values that map an input value on the IN pin 6 to an output value of the ANALOG OUT line 7 on the digital-to-analog converter 5. As discussed above, the mapping values stored in memory 2 can provide a signal processing function, e.g. signal rectification, or correct for non-linearities or other imperfections in the analog-to-analog conversion process of this aspect of the present invention. A serial read/write address decoder 4 serves to select the location in memory to store the data input from the serial interface. One output side of the memory array 2 feeds into a digital-to-analog converter 5. The output of the memory array 2 is an M-bit value stored in the memory cell addressed by the output of the analog-to-digital converter 1. The M-bit value is then converted to an analog value in the normal manner using latches and current switches by the digital-to-analog converter 5. The analog value is then output an ANALOG OUT line 7.

Figure 2:
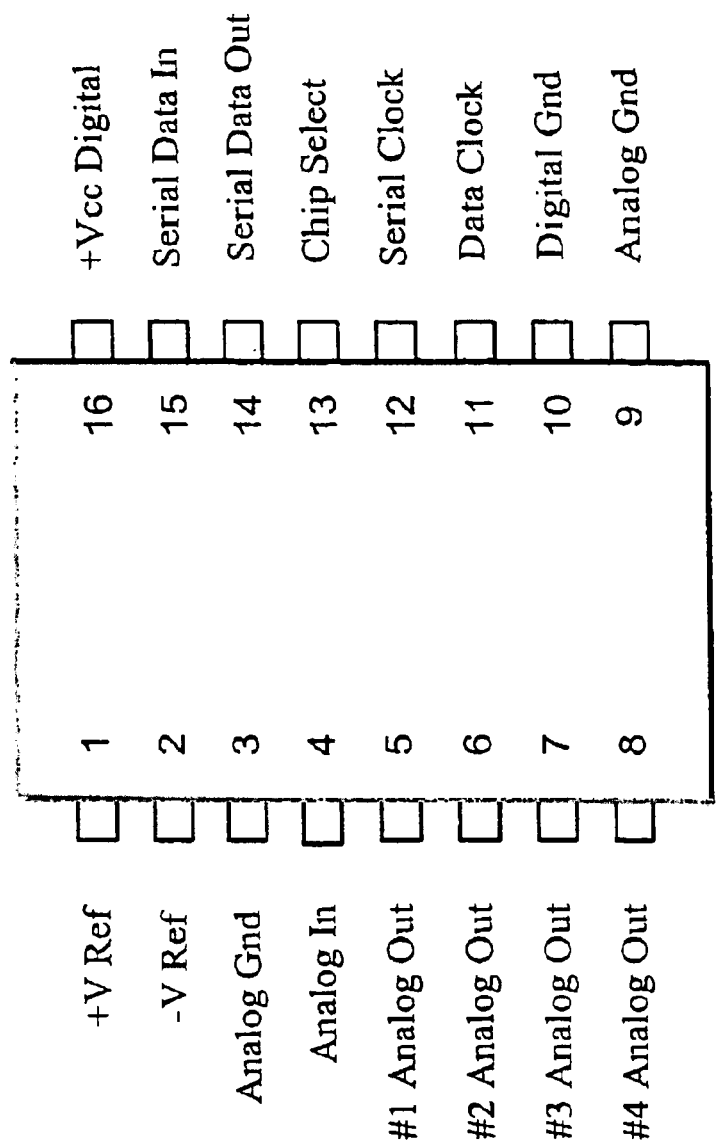
FIG. 2 depicts a pin-out diagram of the exemplary embodiment of FIG. 1 according to another aspect of the present invention.

Turning to FIG. 2, shown therein is an exemplary pin input/output configuration of the exemplary embodiment 10. Voltage references (V+,V−) and Vcc inputs are shown at pins 1, 2 and 16, respectively. The analog input value is provided at pin 4. A digital ground pins are provided at pin 10. An analog ground pins are provided at pins 3 and 9. A serial data Output and Input pins are provided at pins 14 and 15, respectively. A data clock is provided at pin 11. A serial clock is provided at pin 12. A serial chip select line is provided at pin 13. Finally, the analog out lines are provided at pins 5, 6, 7, and 8. Thus, the integrated circuit chip of the present invention is a minimal IC configuration for a four-channel analog output configuration.

Figure 3:
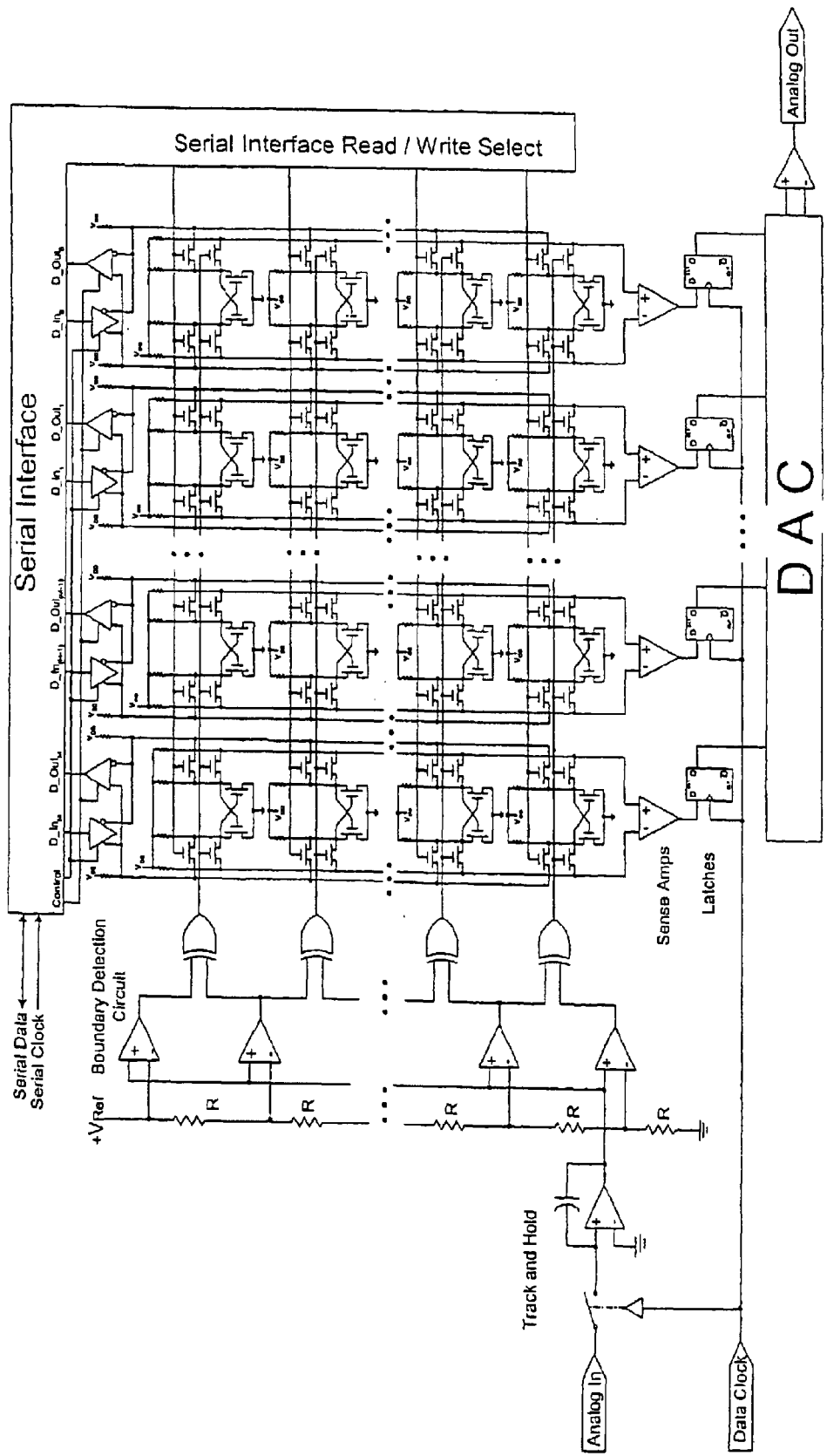
FIG. 3 depicts a detailed block diagram of a dual-port SRAM for use as the memory array in the exemplary embodiment of FIG. 1.

Turning to FIG. 3, shown therein is detailed a dual-port SRAM and how it would be employed as the memory array in exemplary embodiment 10. The data stored in the memory array is read and written from/to the serial interface along the top border. The serial interface includes selector circuits which control which memory cells are addressed along the right border. The boundary detection circuit selects which memory location is enabled to the sense amplifiers, which in turn transfer the differential voltage output of the memory to latches which hold the data stable during the Digital-to-Analog conversion.

Turning to FIG. 4, shown therein is the interconnection between the analog-to-digital converter 1, the memory cells 2 and the digital-to-analog converter 5. The output of the voltage detector (not shown) is coupled to the positive inputs of several voltage comparators 21-1 through 21-N. The negative inputs of the voltage comparators 21-1 through 21-N are coupled to the voltage reference (+,−) via a resistor voltage divider string 22. The outputs of the voltage comparators 21-1 through 21-N are coupled to the inputs of a digital comparator (23-1 through 23-(N-1)). One less (N-1) digital comparator 23-1 through 23-(N-1) is employed than the number (N) of voltage comparators 21-1 through 21-N. The digital comparator 23 outputs a "1" when the inputs are not equal (see FIGS. 5A–D).

Additional Exemplary Embodiment

Figure 7:
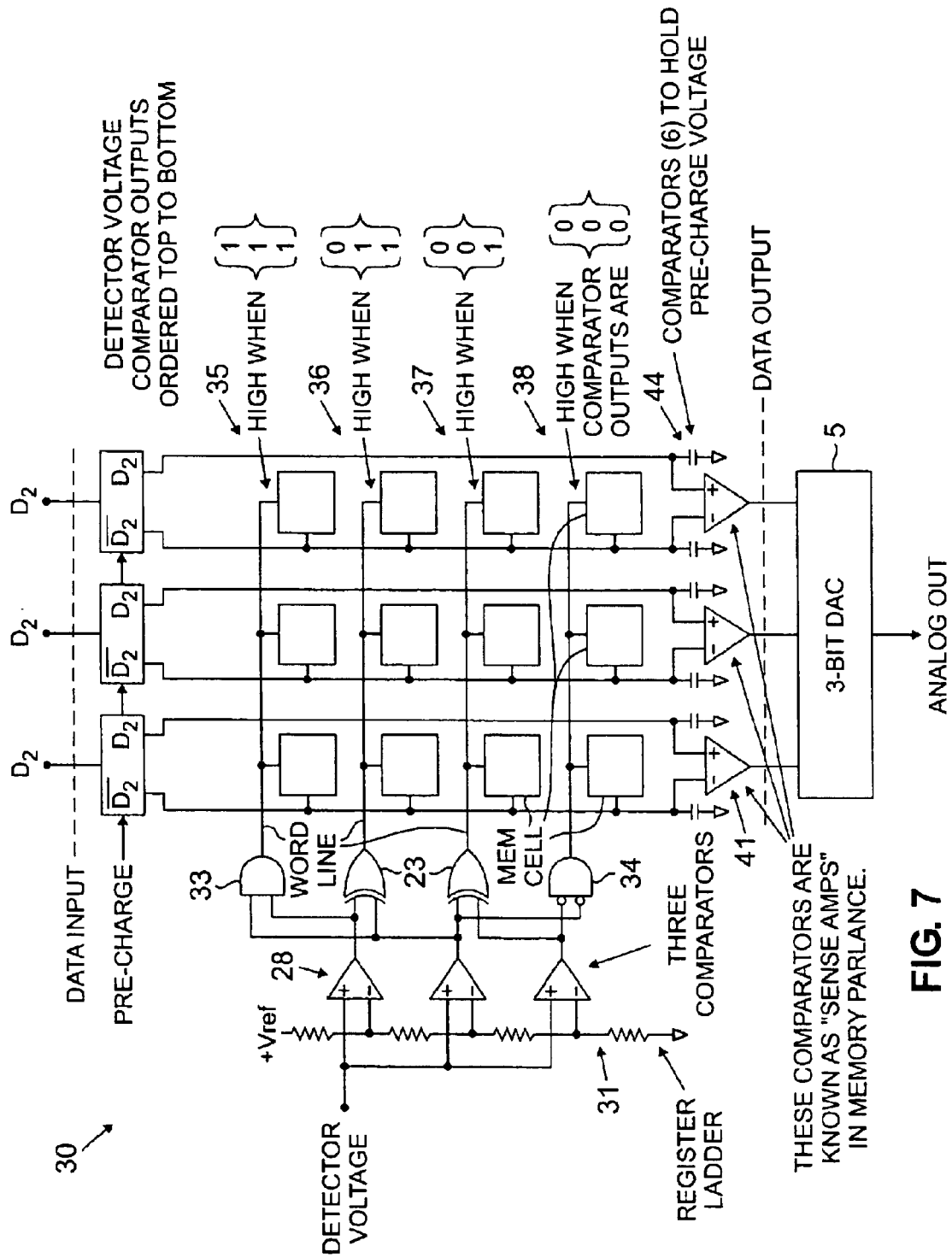
FIG. 7 depicts an exemplary embodiment of a 3-bit analog-to-analog converter according to another aspect of the present invention.

FIG. 7 shows a circuit diagram of an exemplary embodiment 30 of the present invention for a 3-bit configuration, which is illustrated for purposes of simplicity. In this embodiment 30, the detector voltage is coupled to the positive inputs of three voltage comparators 21. The detector voltage comparator outputs are ordered from top to bottom in this embodiment 30. A resistor ladder 31 couples the positive voltage reference to the negative voltage reference. Each rung of the resistor ladder 31 is coupled to one of the voltage comparators 23. Two digital comparators 23 are used in this embodiment 30, along with an AND gate 33 at the top and a NAND gate 34 at the bottom. The output of AND gate 33 is high when the maximum voltage is detected, thus word line {111} 35 is active. When the next voltage level is detected, the output from the digital comparator 23-1 is high, thus addressing word line {011} 36. When the second next voltage level is detected, the output from digital comparator 23-2 is high, thus addressing word line {001} 37. Finally, when there is a minimal voltage detected, the output from NAND gate 34 is high, thereby addressing word line {000} 38.

The values stored in the memory cells 40-ij, where "i" represents the ith column (in this embodiment 30, there are three columns, one for each bit, N, of the conversion processes), and "j" represents the jth row (in this embodiment there are four rows, one more than the number of bits, N, in the conversion processes). The values stored in memory cell 40 appear across its respective comparator 41 as a voltage input to a voltage comparator, known as a "sense amplifier." These sense amplifiers 41 provide the output of the memory array 2 to the digital-to-analog converter 5. In this embodiment there are three outputs, one for each bit of the conversion processes (i.e., in this embodiment 30, N=3). The output of the digital-to-analog converter 5 is an analog voltage.

Capacitors 44 hold the pre-charge voltage at the data input lines. Data lines and inverted data lines are coupled from the pre-charge voltage input across each memory cell for each bit of the N-bit converter.

Memory Cell Embodiments

Figure 8:
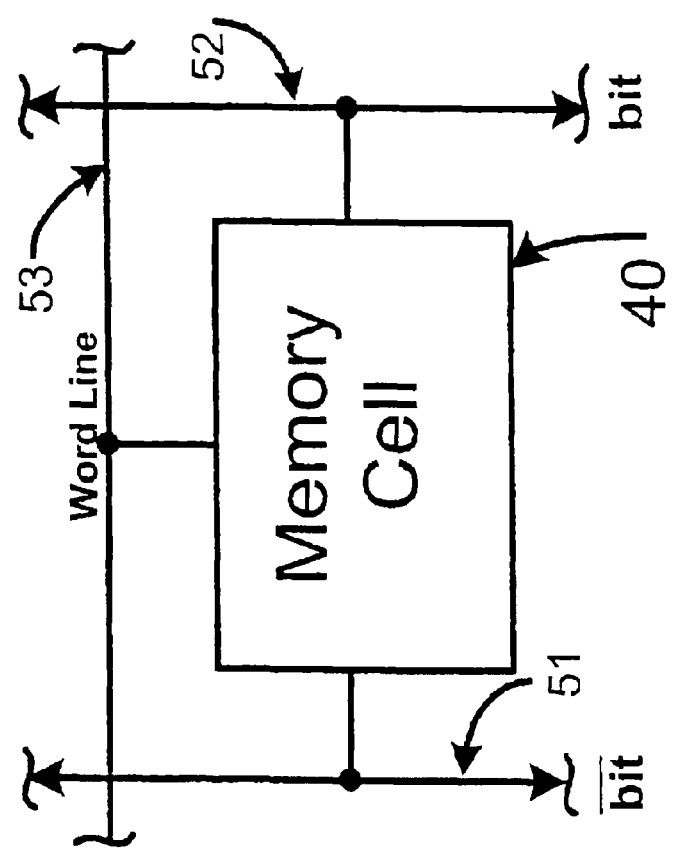
FIGS. 8–10 depict exemplary embodiments of memory cells used in the memory array of the embodiments of the present invention.
Figure 9:
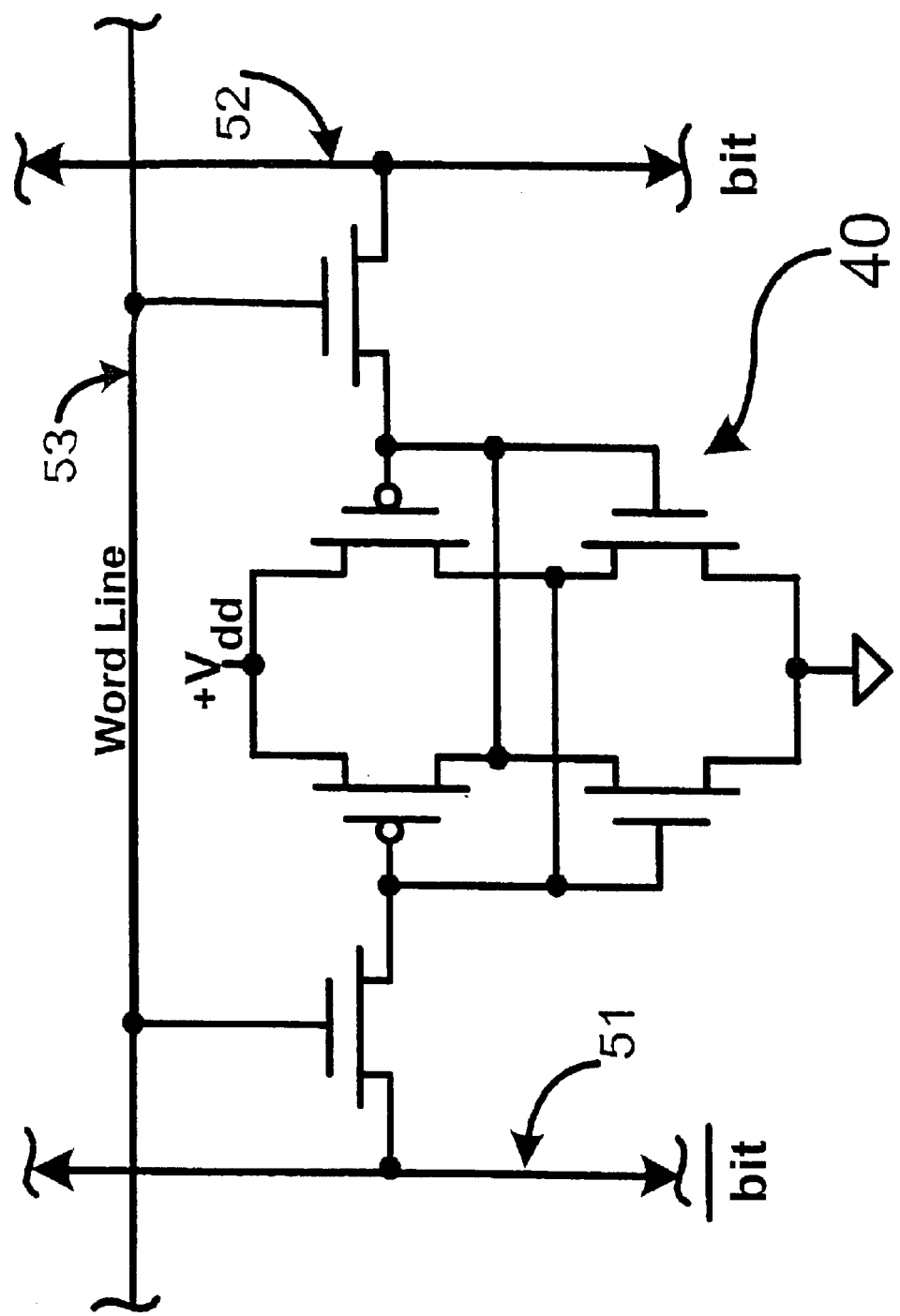
Figure 10:
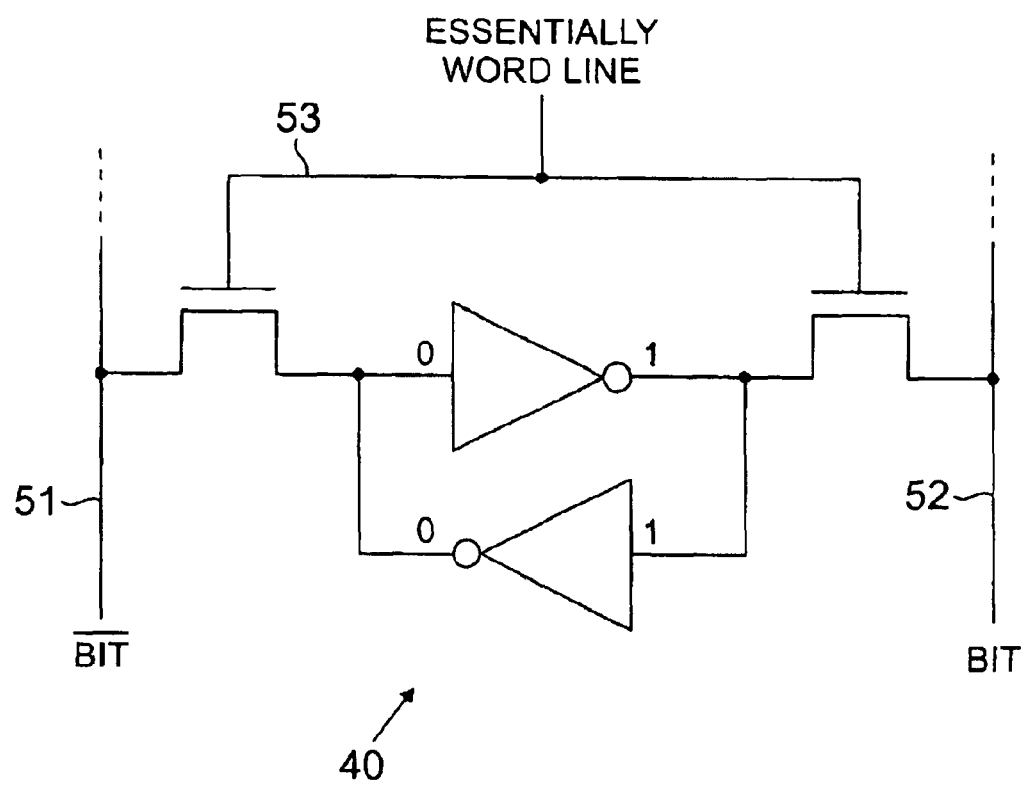

FIG. 8 is a simplified block diagram of each memory cell, which is equivalent to that shown in FIG. 9 and FIG. 10. A memory cell (e.g., an SRAM cell) 40 can be made from two back-to-back (weak) invertors that can be forced to the desired state when the word line 53 is brought high while the data (D0,D1,D2) and inverted data (inverted D0, inverted D1, inverted D2) is on the bit 52 and inverted bit 51 lines.

Thus, this configuration 30 detects the first voltage comparator 21 not outputting a "1" from the bottom up. The output of the digital comparator 23 is directly connected to the read line of the memory cell 40. This causes the output of the addressed memory cells 40 to be fed to the digital-to-analog converter 5.

Additional Embodiment for Capturing Data

Figure 12:
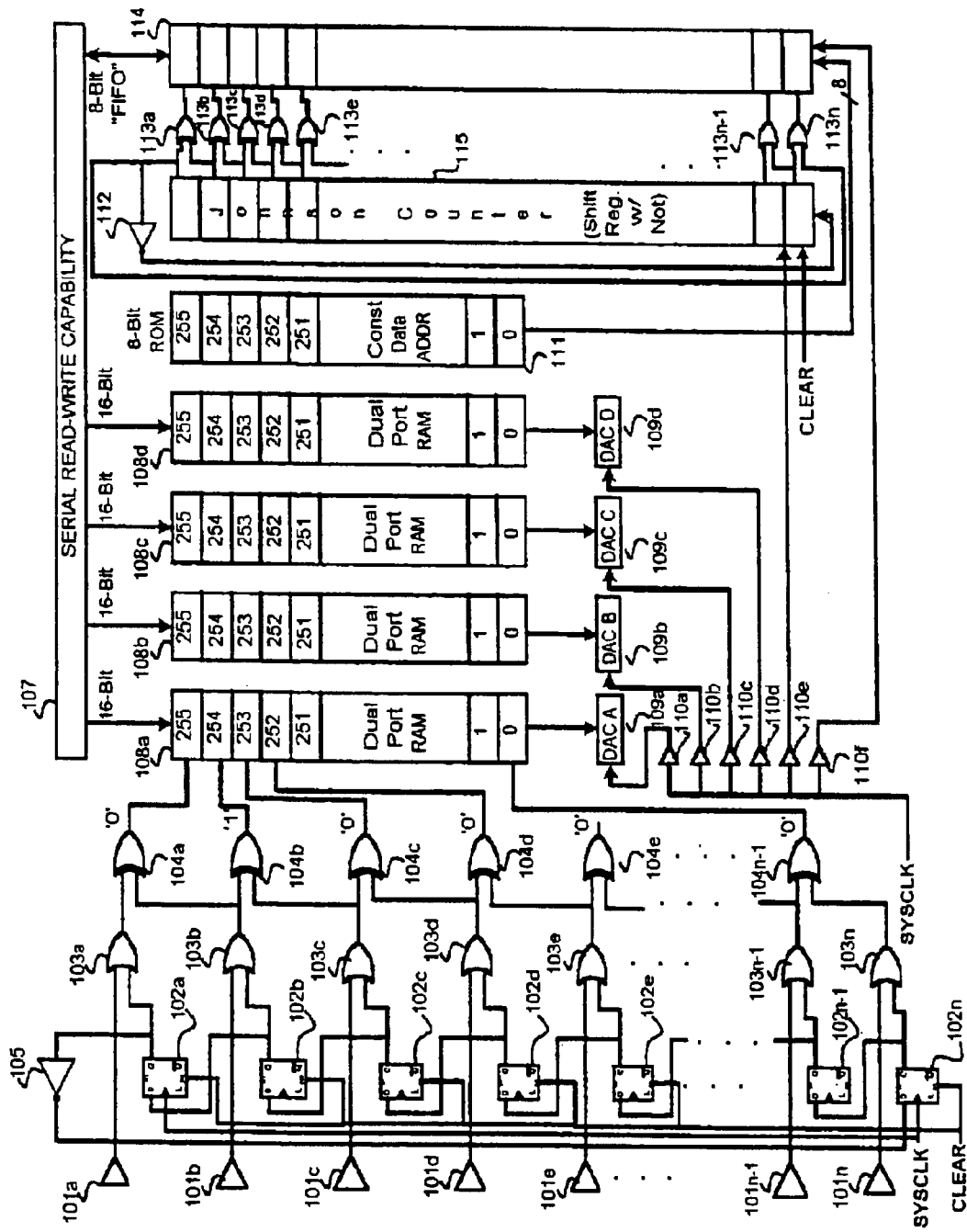
FIG. 12 depicts another exemplary embodiment of an apparatus for rapidly recording an output of an input converter according to another aspect of the present invention.

Turning to FIG. 12, shown therein is an embodiment of an apparatus for rapidly recording the output of the input converter. The look-up table (e.g., dual port RAMs 108a–108d) may additionally contain a table 111 of sequential values, which match their location in the table e.g., the value stored in the bottom-most memory location would be zero (0) and the value stored in memory location N would be N-1, e.g., 255. If these values were connected to an on-chip first-in-first-out (FIFO) memory 114, then the last X values (e.g., at least the length of the FIFO) output from the input converter could be recorded and read out via the serial read/write capability 107. The data stored in the FIFO 114 could be read out through the serial bus for analysis of the incoming signal or for characterization of the input converter's performance by using a known test signal. FIG. 12 shows an exemplary embodiment of this arrangement.

In FIG. 12, the FIFO locations are addressed in sequential fashion using a circular shift register 115 with the input to the bottom-most register inverted from inverter 112. This causes the looping sequence of data to be all logical zeros followed by all logical ones. When clearing the registers, all registers become zero. Then with each clock cycle the top register is output through the inverter 112 and back into the bottom register as a one. Thus, all zeros cycle through the shift register followed by all ones and then again by all zeros, and so on. Exclusive OR (XOR) gates 113a–113-n-1 are connected to adjacent registers, and then only one XOR gate during each clock cycle outputs a logical one, i.e., the XOR gate that straddles the boundary between the ones and the zeros. This is similar to the operation or the XOR gates in the boundary detection of logic used to select the look-up-table mapping. The output of the XOR gates are used to address the registers of the FIFO 114, thereby causing the data output from the constant data address 111 that appears at the input of the FIFO 114 to be placed in the register being activated by the output of the XOR gate that it itself active. The data can be then fed out of the FIFO and into the serial read/write capability 107.

An alternative arrangement to select only one FIFO location at a time would be to perform a presetting operation on the registers of a circular shift register (with no inversion to the input of the first register) wherein one register is set, and the remainder are cleared. The one set bit would circulate and address one FIFO location in each clock cycle.

A further enhancement to this invention is to include a circular shift register at the input to the boundary detection logic block to permit accessing the look-up-table values sequentially. This could aid in system calibrations by applying a fixed pattern to the output formatter to excite the system with a fixed waveform.

This function is included in FIG. 12 although, as described above, it is not required. If the analog input to the level detector is grounded, then all of the comparators will output logical zeros. If a circular shift register were incorporated such that the output of its registers were OR'ed with the outputs of the comparators, then the single logical one shifting sequentially through the registers would affect the selection of the look-up-table values in a sequential fashion. During normal operation, all of the shift registers would be held in a cleared state so the comparator outputs would select the look-up-table values.

Shown in FIG. 12 is the last section of the input converter, which includes the comparators 101a through 101n in an n-bit device. Latches 102a through 102n-1 have their output coupled to an input of OR-gates 103a through 103n, respectively, and also coupled to the input of the next higher latch. Each latch 102a-n has its clock input controlled by the system block (SYSCLK). Thus, on the clock pulses each of the latches 102a through 102n will shift their contents up the ladder. The output of the highest latch is coupled to the input of an inverter 105, whose output in turn is coupled to the input of the lowest latch. The CLEAR signal is coupled to the clear inputs the latches. The second input of OR-gates 103a through 103n is coupled to one of the comparator (101a–101n) outputs. The outputs of OR-gates 103a–103n (taken two at a time) are coupled to one input of exclusive OR-gates 104a through 104n-1. The outputs of exclusive OR-gates 104a through 104n-1 are in turn coupled to one of the memory locations of the Dual Port RAMs 108a–d. The outputs of these Dual Port RAMs 108-d are in turn coupled to Digital-to-Analog Converters (DACs) 109a–d, which are clocked by the system clock (SYSCLK) via devices 110a–d. The output of the 8-bit ROM constant data address 111 is coupled to an 8-bit FIFO 114, which is loaded in parallel by a Johnson Counter (e.g., a shift register with an inverter 112). The Johnson Counter will invert the output and cycle it back to the input. The register values are loaded in parallel to the FIFO 114 via paired XOR-gates 113a–113n. The values in each register are exclusive OR-ed in pairs and the output is then loaded into the FIFO 114 in parallel. The 8-bit FIFO provides the captured data to the serial read-write capability 107.

In normal operation the clear signal is activated. This essentially removes the flip-flops 102a–102n and OR-gates 103a–103n from the circuit, as the outputs of these flip-flops is zero, hence the input to the OR gates 103a–103n is a zero and whatever is being output by the comparators 101a–101n; hence the outputs of the comparators appear at the outputs of the OR gates 103a–103n. Thus, clearing the flip-flops enables normal operation, which simply takes the inputs from the input converter and uses them to address the memory locations as discussed above.

In this embodiment, there are four independent mappings from the input signal; hence there are four Dual Port RAMs 108a–108d and four DACs 109a–109d. Each of these Dual Port RAMs and DACs operate to create an analog signal from the 16-bit value stored in the memory location addressed by the value of the input converter, as discussed above. The active one of the XOR-gates 104a–104n-1 and AND-gate 106 addresses each of the Dual Port RAMs 108a–108d.

An additional 8-bit ROM is used to store the value of the address being addressed. In addition, the same active gate addresses the 8-bit ROM. The value stored in the 8-bit ROM is related to its position in memory, so that lowest position has a value of zero stored in it, whereas the highest position has a value of 255 (for an 8-bit ROM). This value is then output to the FIFO as has been described.

In the high-speed sequential access operation mode, the analog input is first grounded, so that the outputs from all comparators are zero.

Figure 13:
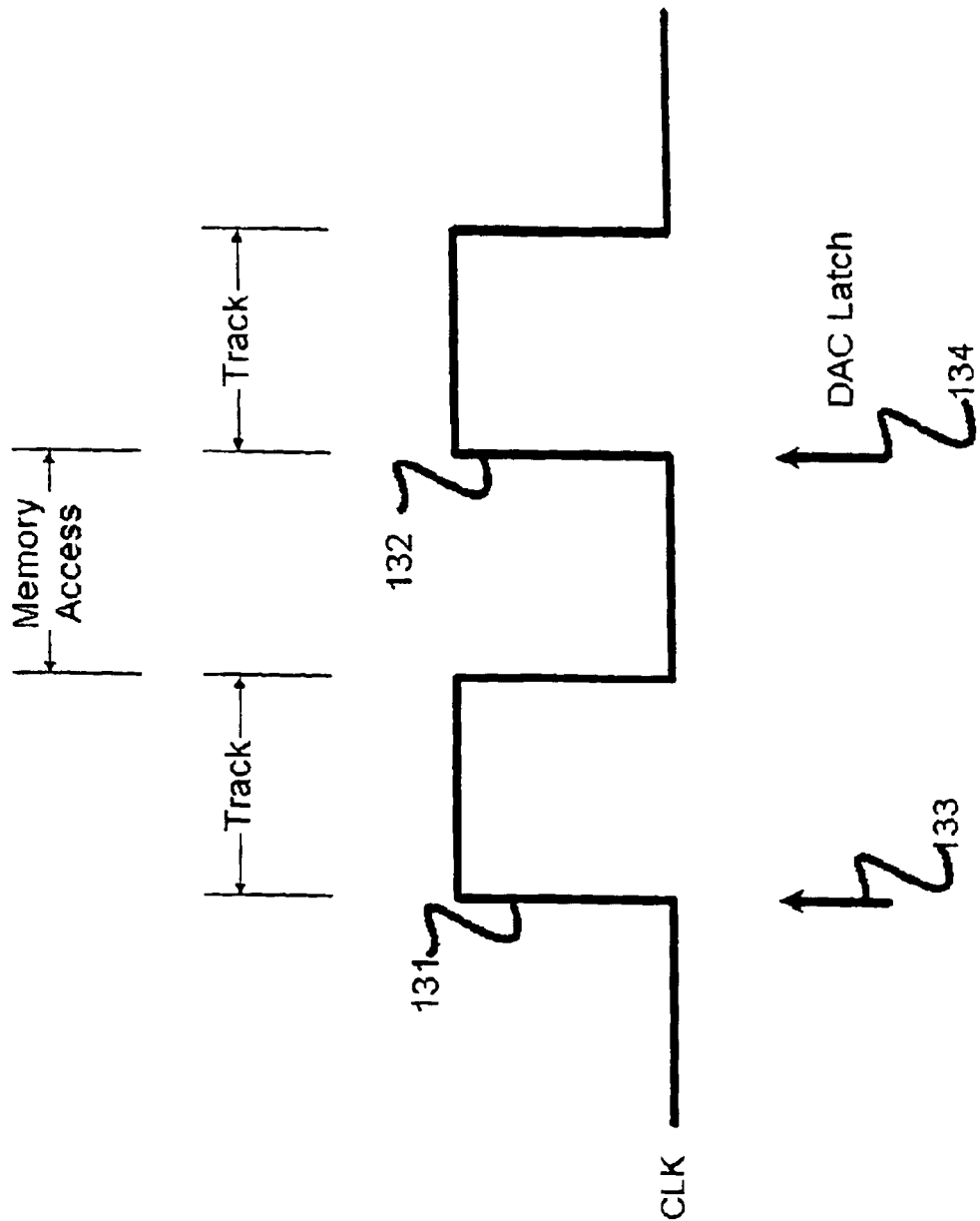
FIG. 13 depicts a timing diagram applicable to the exemplary embodiment of FIG. 12 according to another aspect of the present invention.

Turning to FIG. 13, show therein is a timing diagram that controls the operation of the apparatus of FIG. 12. The system clock pulse is shown and at the rising edges 131, 132 the data is tracked. During the low portions of the clock signal, the memory is accessed. At each rising edge 131, 132 the DAC latches operate. Thus, at the first rising edge, the analog signal is held in a capacitor. During the low period the memory is addressed by the output of the logic circuit and read out to the DACs 109a–d. At the next rising edge, the data is latched (DAC latches close on arrows 113, 134) into the DACs 109a–d, and the cycle repeats.

Turning to FIG. 15 shown therein is a comparison of a traditional ADC-LUT-DAC component chain to an embodiment of the present invention for an analog-to-analog converter. As evident from the drawing, multiple levels of pin drivers and input buffers are avoided, as well as both a binary encoding operation and a binary decoding operation. Moreover, the output side latch from the lookup table is coupled directly to the digital-to-analog converter, thereby saving additional circuitry.

Although various embodiments are specifically illustrated and described herein, it will be appreciated that modifications and variations of the invention are covered by the above teachings and are within the purview of the appended claims without departing from the spirit and intended scope of the invention. For example, while many different values are stated for the number of gradations in the input conversion process, others are also possible including but not limited to anything above sixteen or so without departing from the scope of the present invention. Furthermore, these examples should not be interpreted to limit the modifications and variations of the invention covered by the claims but are merely illustrate of possible variations.

What is claimed is:

1. An apparatus for modifying an input waveform comprising:

a level detector to detect an amplitude of the input waveform at a plurality of predetermined levels;

a boundary detection logic circuit coupled to the level detector including one output line for each of the plurality of predetermined levels, only one of which output lines is active at a time to indicate a level of the input waveform; and an input-to-output mapping device having a plurality of memory locations, each of which are coupled to only one of the plurality of output lines of the boundary detection logic circuit, said input-to-output mapping device using an active output line of the plurality of output lines of the boundary detection logic circuit to select a modified output based on a predetermined mapping from an input value to an output value and outputting the modified output.

2. The apparatus according to claim 1, wherein the level detector includes a resistors ladder network having a plurality of outputs, at least one for each step of the ladder network, and a plurality of differential amplifiers, each of said plurality of different amplifiers being coupled to one of the plurality of outputs of the resistor ladder network, wherein each of said plurality of differential amplifiers outputs a signal when the amplitude of the input signal exceeds a voltage level of a particular step in the resistor ladder network to which the input of said each differential amplifier is coupled.

3. The apparatus according to claim 2, wherein the input-to-output mapping device includes a plurality of mapping locations and each of the outputs of the boundary detection logic circuit are coupled to one and only one of the plurality of mapping locations.

4. The apparatus according to claim 1, wherein the level detector, the boundary detection logic circuit and the input-to-output mapping device are disposed in an integrated package.

5. The apparatus according to claim 1, further comprising an output formatter coupled to the output of the input-to-output mapping device, said output formatter to convert an output of the input-to-output mapping device to a predetermined analog or digital form.

6. The apparatus according to claim 5, wherein the level detector, the boundary detection logic circuit, the input-to-output mapping device and the digital-to-analog converter are all disposed in an integrated package.

7. The apparatus according to claim 5, wherein the output formatter comprises a digital-to-analog converter.

8. The apparatus according to claim 7, wherein the input-to-output mapping device includes a plurality of mapping locations, each storing a mapping value, and each of a plurality of comparators are coupled to only one of the plurality of mapping locations.

9. The apparatus according to claim 1, wherein the input-to-output mapping device includes a memory storing a lookup table having a plurality of entries, each of which includes a mapping value and said boundary detection logic circuit addresses one of the entries at a time based on a value of the input waveform.

10. The apparatus according to claim 1, wherein the input-to-output mapping device further comprises an external write input which mapping values can be input into the input-to-output mapping device.

11. The apparatus according to claim 1, wherein the input-to-output mapping device includes a plurality of mapping tables and a selection input via which one of the plurality of mapping tables is selectable.

12. The apparatus according to claim 1, wherein the boundary detection logic circuit includes one or more latches coupled to a plurality of comparators.

13. The apparatus according to claim 9, wherein said memory is user programmable to store output mappings of an analog signal based on input values of the analog signal.

14. The apparatus according to claim 4, further comprising a common voltage/current reference coupled to the level detector, the boundary detection logic circuit and the input-to-output mapping device.

15. The apparatus according to claim 4, further comprising a common clock coupled to the level detector, the boundary detection logic circuit and the input-to-output mapping device.

16. The apparatus according to claim 1, further comprising a table including a plurality of locations storing a plurality of address values, each address value of which is indicative of a relative position in the table in which said each address value is stored, wherein said relative position in the table also corresponds to a level of the input waveform, said table having an output outputting an address value stored in a location of the plurality of locations being addressed by the active output line of the plurality of output lines of the boundary detection logic circuit.

17. The apparatus according to claim 16, further comprising an address register having a plurality of registers, said address register having an input coupled to the table, receiving an successive clock cycles the output of the table and storing said successive outputs of the table in the plurality of registers.

18. An analog-to-analog converter or convert an input signal to a desired output signal comprising:
a level detector to detect an amplitude of the input signal, said level detector including a plurality of outputs each of which are associated with one of a plurality of predetermined amplitude levels, more than one of which outputs can be active at any time indicating whether the amplitude exceeds a particular level of the plurality of predetermined amplitude levels to which a particular output of the plurality of outputs is associated;
a boundary detection logic circuit coupled to the level detector and having a plurality of logic outputs, each of which are associated with one level of the predetermined amplitude levels, only one of which logic outputs can be active at any time indicating that the amplitude of the input signal met or exceeded a particular level of the predetermined amplitude levels to which a particular logic output of the plurality of logic outputs is associated but did not meet or exceed a next higher level of the plurality of predetermined levels;
a memory having a plurality of read locations, each of the plurality of read locations being coupled to one of the plurality of logic outputs; and
a digital-to-analog converter coupled to the output of the memory and converting a received input to an analog output based on a selected read location value that is read by an active logic output.

19. The analog-to-analog converter according to claim 18, wherein said memory is user programmable to store output mappings of an analog signal based on input values of the analog signal.

20. The analog-to-analog converter according to claim 18, wherein a stored value in a read location of the memory controls an output value of the digital-to-analog converter.

21. The analog-to-analog converter according to claim 18, further comprising a common voltage reference coupled to the digital-to-analog converter, the memory, the level detector and the boundary detection logic circuit.

22. The analog-to-analog converter according to claim 18, further comprising a common clock coupled to the digital-to-analog converter, the memory, the level detector and the boundary detection logic circuit.

23. The apparatus according to claim 18, further comprising a table including a plurality of locations storing a plurality of address values, each address value of which is indicative of a relative position in the table in which said each address value is stored, wherein said relative position in the table also corresponds to the amplitude of the input signal, said table having an output outputting an address value stored in a location of the plurality of locations being addressed by the active logic output of the plurality of logic outputs of the boundary detection logic circuit.

24. The apparatus according to claim 23, further comprising an address register having a plurality of registers, said address register having an input coupled to the table, receiving on successive clock cycles the output of the table and storing said successive outputs of the table in the plurality of registers.

25. A method for controlling an electrical signal comprising:

detecting whether one or more levels of a plurality of predetermined levels have been exceeded by the electrical signal;

using a boundary detection of logic to determine a highest level that was exceeded by the electrical signal;

using an active output of the boundary detection logic to select a read location in a memory having at least one read location for each of the plurality of predetermined levels; and storing a value in each of the read locations of the memory that maps an incoming amplitude of the electrical signal to an output amplitude of the electrical signal.

26. The method according to claim 25, further comprising using the stored value in the selected read location as an input to a digital-to-analog converter, which converts the input to an analog output.

27. The method according to claim 25, further comprising directly connecting each of outputs of the boundary detection of logic to one read location in the memory.

28. The method according to claim 25, further comprising using a common reference voltage and clock for the boundary detection of logic and the memory.

29. The method according to claim 26, further comprising disposing the boundary detection of logic, the memory and the digital-to-analog converter in an integrated package.

30. The method according to claim 29, further comprising addressing an additional memory location with the active output of the boundary detection logic circuit, in which additional memory location is stored a value representative of a relative position in memory of the additional memory location; and outputting each addressed value of the additional memory location on successive clock cycles to a register.

31. An apparatus for processing an analog signal comprising:

a voltage detector to output a detected voltage;

a first voltage/current reference source;

a second voltage/current reference source;

a resistor ladder having a plurality of legs and being coupled between the first and second voltage/current sources;

a plurality of comparators, each having two inputs, one of said two inputs being coupled to one of the legs of the resistor ladder and another of the two inputs being coupled to the output of the voltage detector, and each of the plurality of comparators providing an output;

a plurality of digital comparators, each being coupled between outputs of two voltage comparators, only one of said digital comparators providing a high output at a time;

a memory array including a plurality of memory cells arranged in a matrix, wherein one row of the matrix is addressable at a time by the one of said digital comparators that is high.

32. The apparatus according to claim 31, further comprising a digital-to-analog converter being coupled to the memory array and receiving a content of a row of memory cells being addressed by the one of the digital comparators that is high and converting the received contents to an analog value.

33. The apparatus according to claim 32, further comprising a clock, wherein the digital-to-analog converter includes a latch controlled by the clock, said latch receiving the outputs of the addressed row of memory cells, said digital-to-analog converter also including a plurality of current switches being coupled to the latch and converting the latched values to an analog value.

34. An apparatus for reading or modifying data comprising:

a level detector having an analog input to receive an analog voltage of an analog signal and having a plurality of outputs, each of which is indicative of whether the analog voltage exceeded a particular voltage level associated with said each output;

a logic stage having a plurality of inputs coupled to the plurality of outputs of the level detector, each of the plurality of inputs of the logic stage being associated with a particular voltage level of the analog signal, said logic stage including a plurality of outputs only one of which is active at a time indicating a highest level of the associated voltage levels that was exceeded by the analog signal;

a memory including:
a first table including a plurality of locations storing a plurality of input-to-output mapping values, wherein said active output of the plurality of outputs of the logic stage is used to address one of the plurality of locations in the first table and thereby read a mapping value stored therein; and a second table including a plurality of locations storing a plurality of address values, each address value of which is indicative of a relative position in the second table in which said each address value is stored, wherein said relative position in the second table also correspond to a value of the analog voltage used to address the first table, said second table having an output outputting an address value stored in a location of the plurality of locations being addressed by the active output of the plurality of outputs of the logic stage;

an address register having a plurality of registers, said address register having an input coupled to the second table, receiving on successive clock cycles the output of the second table and storing said successive outputs of the second table in the plurality of registers.

35. The apparatus according to claim 34, further comprising a read/write capability coupled to the output of the address register and to the memory.

36. The apparatus according to claim 34, wherein inputting an active signal to the clear input of the latch places the apparatus in a normal mode in which on successive clock cycles successive analog values are mapped to predetermined values in accordance with the mapping values stored in the first table, and grounding the analog input places the apparatus in a high speed sequential access mode in which successive values of the analog voltage on successive clock cycles are output from the second table to the address register, thereby making the successive values of the analog voltage available for output to the read/write address capability.

37. The apparatus according to claim 34, wherein the address register further comprises:

a first shift register having a first plurality of registers, a value in each of which is cyclically shifted once every clock cycle into an adjacent register of the first plurality of registers, said first shift register including an inverter having an input coupled to a last register of the first plurality of registers and having an output coupled to a first register of the first plurality of registers;

a second register including a second plurality of registers and having an input coupled to the output of the second table, each of the second plurality of registers having an enable input controlling whether the input to the second register is stored in said each register of the second plurality of registers of the second register, said second register including an output; and a plurality of exclusive OR-gates, each having an output and having two inputs coupled to two successive registers of the first plurality of registers, one exclusive OR-gate having one input coupled to a highest register of the first plurality of register and another input coupled to a lowest register of the first plurality of registers, each output of the plurality of exclusive OR-gates being coupled to one enable input of one of the second plurality of registers, thereby controlling whether the output of the second table is input to said one of the second plurality of registers.

38. The apparatus according to claim 37, wherein the second register comprises a first-in-first-out register.

39. The apparatus according to claim 34, wherein the logic stage further comprises:

a plurality of flip-flops, one flip-flop coupled to each of the plurality of inputs, each of the flip-flops having an output and having an input coupled to an output of a flip-flop associated with a next lower voltage level of the plurality of flip-flops, at least one of the flip-flops having a clear input;

an inverter having an input coupled to a flip-flop associated with a highest voltage level and having an output being coupled to an input of a flip-flop associated with a lowest voltage level of the plurality of flip-flops;

a plurality of OR-gates, each OR-gate having an output and a first input coupled to one of the flip-flops of the plurality of flip-flops and a second input coupled to one of the plurality of outputs of the input converter;

a plurality of exclusive OR-gates, each exclusive OR-gate having an output forming one of the plurality of outputs of the logic stage and two inputs coupled to two outputs of two OR-gates of the plurality of OR-gates associated with successive voltage levels of the analog signal; and an AND-gate having two inputs coupled to two outputs of two OR-gates of the plurality of OR-gates associated with two highest voltage levels of the analog signal and having an output.

40. The apparatus according to claim 34, wherein the first table comprises one or more tables each storing a plurality of input-to-output mapping values, wherein said active output of the plurality of outputs of the logic stage is used to address one location in each of the one or more tables and thereby read one or more mapping values stored therein.

41. The apparatus according to claim 40, wherein the memory comprises a dual port random access memory unit for each of the one or more tables.

42. The apparatus according to claim 40, further comprising one or more digital-to-analog converters each coupled to one of the one or more tables of the first table and converting a mapping value output by said one of the one or more tables of the first table to an analog value.

43. A method for processing an analog signal comprising:

converting the analog signal to a binary value and outputting the binary value on an output lead associated with a particular voltage level representative of a highest voltage level of the analog signal exceeded by the analog signal during a predetermined period;

addressing one or more memory locations with the binary value, in which one or more memory locations are stored one or more mapping values mapping the highest voltage level of the analog signal exceeded by the analog signal during the predetermined period to one or more predetermined values;

addressing an additional memory location with the binary value, in which additional memory location is stored a value representative of a relative position in memory of the additional memory location; and outputting each addressed value of the additional memory location on successive clock cycles to a register.

44. The method according to claim 43, further comprising converting one or more addressed mapping values to one or more analog values.

45. The method according to claim 43, further comprising reading a contents of the register.

* * * * *

UNITED STATES PATENT AND TRADEMARK OFFICE
CERTIFICATE OF CORRECTION

PATENT NO. : 6,812,874 B1
DATED : November 2, 2004
INVENTOR(S) : Robert Everest Johnson It is certified that error appears in the above-identified patent and that said Letters Patent is hereby corrected as shown below:

Column 1,
Line 25, after "have", change "been" to -- begun --.
Line 31, before "converts", change "by" to -- but --.
Line 53, after "essentially", insert -- a --.
Line 59, change "amendable" to -- amenable --.

Column 2,
Line 38, change "inter alia" to -- *inter alia* --.
Line 55, after "voltage", delete ",".

Column 3,
Line 15, change "inter alia" to -- *inter alia* --.
Line 23, after "apparatus", change "include" to -- includes --.
Line 32, after "package", insert -- , --.

Column 7,
Line 17, delete last word "an".

Column 8,
Line 56, after last word "input", delete ",".

Column 9,
Line 41, after "voltage", change "references" to -- reference --.
Line 48, after "not", insert -- in --.

Column 10,
Line 2, change last word "word" to -- Word --.
Line 11, after "track", insert -- of --.
Line 19, delete last word "and".

UNITED STATES PATENT AND TRADEMARK OFFICE
CERTIFICATE OF CORRECTION

PATENT NO.    : 6,812,874 B1
DATED         : November 2, 2004
INVENTOR(S)   : Robert Everest Johnson It is certified that error appears in the above-identified patent and that said Letters Patent is hereby corrected as shown below:

<u>Column 10 (cont'd),</u>
Line 32, after "converter 1", change "and" to -- are --.

Signed and Sealed this

Third Day of May, 2005

JON W. DUDAS
*Director of the United States Patent and Trademark Office*

UNITED STATES PATENT AND TRADEMARK OFFICE
CERTIFICATE OF CORRECTION

PATENT NO. : 6,812,874 B1  
DATED : November 2, 2004  
INVENTOR(S) : Robert Everest Johnson Page 1 of 2

It is certified that error appears in the above-identified patent and that said Letters Patent is hereby corrected as shown below:

Column 1,  
Line 25, after "have", change "been" to -- begun --.  
Line 31, before "converts", change "by" to -- but --.  
Line 53, after "essentially", insert -- a --.  
Line 59, change "amendable" to -- amenable --.

Column 2,  
Line 38, change "inter alia" to -- *inter alia* --.  
Line 55, after "voltage", delete ",".

Column 3,  
Line 15, change "inter alia" to -- *inter alia* --.  
Line 23, after "apparatus", change "include" to -- includes --.  
Line 32, after "package", insert -- , --.

Column 7,  
Line 17, delete last word "an".

Column 8,  
Line 56, after last word "input", delete ",".

Column 9,  
Line 41, after "voltage", change "references" to -- reference --.  
Line 48, after "not", insert -- in --.

Column 10,  
Line 2, change last word "word" to -- Word --.  
Line 11, after "track", insert -- of --.  
Line 19, delete last word "and".  
Line 32, after "converter 1", change "and" to -- are --.  
Line 65, before "digital," delete "A".  
Line 65, change "digital" to -- Digital --.  
Line 66, before "analog", delete "An".  
Line 66, change "analog" to -- Analog --.  
Line 66, delete last word "A".  
Line 67, change first word "serial" to -- Serial --.

Column 14,  
Line 4, before "successive", change "an" to -- on --.  
Line 30, change "correspond" to -- corresponds --.  
Line 38, after "input" (first occurrence), insert -- via --.  
Line 42, after "merely", change "illustrate" to -- illustrative --.

UNITED STATES PATENT AND TRADEMARK OFFICE
CERTIFICATE OF CORRECTION

PATENT NO. : 6,812,874 B1
DATED : November 2, 2004
INVENTOR(S) : Robert Everest Johnson It is certified that error appears in the above-identified patent and that said Letters Patent is hereby corrected as shown below:

Column 14 (cont'd),
Line 63, change "resistors" to -- resistor --.

Column 19,
Line 9, after "of", change "register." to -- registers --.

This certificate supersedes Certificate of Correction issued May 3, 2005.

Signed and Sealed this

Twenty-fifth Day of October, 2005

JON W. DUDAS
*Director of the United States Patent and Trademark Office*